(12) United States Patent
Skertic et al.

(10) Patent No.: US 11,889,661 B2
(45) Date of Patent: Jan. 30, 2024

(54) INTEGRATED CIRCUIT THERMAL MANAGEMENT SYSTEM

(71) Applicants: Rolls-Royce North American Technologies Inc., Indianapolis, IN (US); Rolls-Royce Corporation, Indianapolis, IN (US)

(72) Inventors: Richard Joseph Skertic, Carmel, IN (US); Eric E. Wilson, Mooresville, IN (US); John Joseph Costello, Indianapolis, IN (US)

(73) Assignees: ROLLS-ROYCE NORTH AMERICAN TECHNOLOGIES INC., Indianapolis, IN (US); ROLLS-ROYCE CORPORATION, Indianapolis, IN (US)

( * ) Notice: Subject to any disclaimer, the term of this patent is extended or adjusted under 35 U.S.C. 154(b) by 805 days.

(21) Appl. No.: 17/024,671

(22) Filed: Sep. 17, 2020

(65) Prior Publication Data

US 2022/0087068 A1     Mar. 17, 2022

(51) Int. Cl.

| | |
|---|---|
| H05K 7/20 | (2006.01) |
| F28D 15/02 | (2006.01) |
| H01F 1/01 | (2006.01) |
| H01F 7/06 | (2006.01) |

(52) U.S. Cl.
CPC ......... *H05K 7/20381* (2013.01); *F28D 15/02* (2013.01); *H01F 1/012* (2013.01); *H01F 7/064* (2013.01); *H05K 7/20336* (2013.01)

(58) Field of Classification Search
CPC .......... F28D 15/06; F28D 15/02; H01F 7/081; H01F 7/064; H01F 1/012; H05K 7/20336; H05K 7/20381; F28F 2013/008

USPC .......................................................... 361/139
See application file for complete search history.

(56) References Cited

U.S. PATENT DOCUMENTS

| | | |
|---|---|---|
| 3,841,107 A | 10/1974 | Clark |
| 5,091,361 A | 2/1992 | Hed |
| 6,739,137 B2 | 5/2004 | Minovitch |
| 8,763,407 B2 | 7/2014 | Carroll et al. |

(Continued)

OTHER PUBLICATIONS

Momen, A.M., "Magnetocaloric Refrigerator Freezer," dated Apr. 13, 2014, pp. 1-21, 2014 Building Technologies Office Peer Review, US Department Of Energy, Oak Ridge National Laboratory, Oak Ridge, TN.

(Continued)

*Primary Examiner* — Kevin J Comber
(74) *Attorney, Agent, or Firm* — Crowell & Moring LLP (57) ABSTRACT

An integrated circuit thermal management system includes an enclosure, a heat exchanger, an integrated circuit, a slide having a moveable slide body, an electromagnetic coil, a magneto caloric material and controller circuitry. The heat exchanger is positioned on a first side of the enclosure, and the integrated circuit is positioned on a second side of the enclosure with a temperature sensor configured to generate a temperature signal indicative of a temperature of the integrated circuit. The slide is disposed in the enclosure extending between the heat exchanger and the integrated circuit. The electromagnetic coil and the magnetocaloric material are included on the slide body. The controller is configured to control energization of the magnetic coil and movement of the magnetocaloric material on the slide body between the heat exchanger and the integrated circuit based on the temperature signal.

20 Claims, 6 Drawing Sheets

(56) References Cited

U.S. PATENT DOCUMENTS

2004/0182086 A1   9/2004   Chiang et al.
2006/0278373 A1   12/2006  Hsu
2013/0319012 A1   12/2013  Kuo et al.
2017/0138646 A1   5/2017   Ihnfeldt et al.

OTHER PUBLICATIONS

"Magnetic Refrigeration," dated Jun. 28, 2020, pp.1-8, Wikipedia, available at URL: https://en.wikipedia.org/Magnetic_refrigeration.
Bouza AM et al, "Using Magnets to Keep Cool: Breakthrough Technology Boosts Energy Efficiency of Refrigerators," dated Jul. 29, 2014, pp. 1-5, Office of Energy Efficiency & Renewable Energy, Washington, DC.

INTEGRATED CIRCUIT THERMAL MANAGEMENT SYSTEM

TECHNICAL FIELD

This disclosure relates to thermal management systems and, in particular, to an integrated circuit thermal management system for use in integrated circuit applications subject to wide ranges of environmental temperatures, such as in a gas turbine engine.

BACKGROUND

Gas turbine engines are used on vehicles such as airplane and helicopters. These engines are internal combustion engines that operate with high temperatures to produce thrust by discharging a high velocity exhaust. Some gas turbine engines can also include fan blades to create thrust.

Gas turbine engines include one or more compressors, a combustor and one or more turbines. Air is compressed in the compressor(s), mixed with fuel in the combustor and ignited, such that hot exhaust gases are created by the combustion and discharged through a turbine to create thrust. The exhaust gas rotates the turbine, which is typically used to turn a shaft and produce shaft work output, such as to drive the compressor or a gearbox. There can be one or more turbines and corresponding shafts producing shaft work output. Control of gas turbine engines may include one or more control systems. Such control systems may include circuit boards having semiconductors, which can be impacted negatively by high or low temperatures outside their rated range of operating temperature. Due to high temperatures resulting from combustion, and low environmental temperatures resulting from circumstances, such as high altitude travel of an airplane, the location, cooling and heating of such circuit boards in and around gas turbine engines and other systems and devices subject to wide temperature variations is an ongoing concern.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

A integrated circuit thermal management system includes controller circuitry to monitor a temperature sensor sensing a temperature of an integrated circuit. The integrated circuit may be deployed in a vehicle or other system or device for active thermal management. The integrated circuit may be maintained within a predetermined temperature range, by operation of the integrated circuit thermal management system. For example, integrated circuit may be maintained at or below a predetermined threshold temperature even where the integrated circuit is subject to relatively high ambient temperatures, such as in areas near the engine core where the combustion process of the gas turbine engine is occurring. Additionally, or alternatively, the integrated circuit may be maintained at or above a predetermined threshold temperature even where the integrated circuit is subject to relatively low ambient temperatures, such as when installed in an aircraft at high altitudes. For purposes of brevity, the following discussion focuses on examples of cooling the integrated circuit using the integrated circuit thermal management system, however, one skilled in the art would recognize that examples of heating the integrated circuit may also be implemented with the integrated circuit thermal management system.

The integrated circuit thermal management system may include at least one enclosure, at least one heat exchanger, at least one slide and at least one integrated circuit disposed with in the at least one enclosure. The slide may include a slide body having a magnetic coil positioned to surround a magnetocaloric material. The controller circuitry is configured to enable the slide to move the slide body to a first position proximate the heat exchanger based on the temperature of the integrated circuit. While the slide body is in the first position, the controller circuitry may maintain an electromagnetic coil in an energized state, and the magnetocaloric material may be in thermal communication with the heat exchanger.

The controller circuitry may selectively enable the slide body to move to a second position proximate the integrated circuit such that the magnetocaloric material is in thermal communication with the integrated circuit and not the heat exchanger. The controller circuitry is configured to maintain the magnetic coil in a deenergized state while the slide body is in the second position and the magnetocaloric material is in thermal communication with the integrated circuit. The controller circuitry is further configured to enable the slide body to repeatedly move between the first position in thermal communication with the heat exchanger or the second position in thermal communication with the integrated circuit based on a temperature of the integrated circuit.

One interesting feature of the system described herein relates to a first heat pipe contiguously contacting and extending away from the heat exchanger, and a second heat pipe contiguously contacting and extending away from the integrated circuit toward the first heat pipe to provide a gap between the first heat pipe and the second heat pipe. The controller circuitry is configured to control the slide to reciprocate the slide body between the first position and the second position on a rail, the rail comprising the first heat pipe axially aligned with the second heat pipe, with the gap there between.

Alternatively, or in addition, an interesting feature of the system described herein is that the controller circuitry is configured to energize the electromagnetic coil while the slide body is at the first position and de-energize the electromagnetic coil while the slide body is at the second position such that the magnetocaloric material dispenses heat energy to the heat exchanger and absorbs heat energy from the integrated circuit.

Alternatively, or in addition, an interesting feature of the system described herein is that the controller circuitry is configured to energize the electromagnetic coil while the slide body is at the second position and de-energize the electromagnetic coil while the slide body is at the first position such that the magnetocaloric material dispenses heat energy to the integrated circuit and absorbs heat energy from the heat exchanger.

Alternatively, or in addition, an interesting feature of the system described herein is that the controller circuitry is configured to control the magnetocaloric material as a heat pump in adiabatic cycle such that the magnetocaloric material is either in thermal communication with the heat exchanger during a heat dispensing mode, or in thermal communication with the integrated circuit during a heat absorption portion of the thermal management process. Alternatively, or in addition, the magnetocaloric material is either in thermal communication with the heat exchanger during a heat absorption mode, or in thermal communication with the integrated circuit during a heat sourcing portion of the thermal management process.

Figure 1:
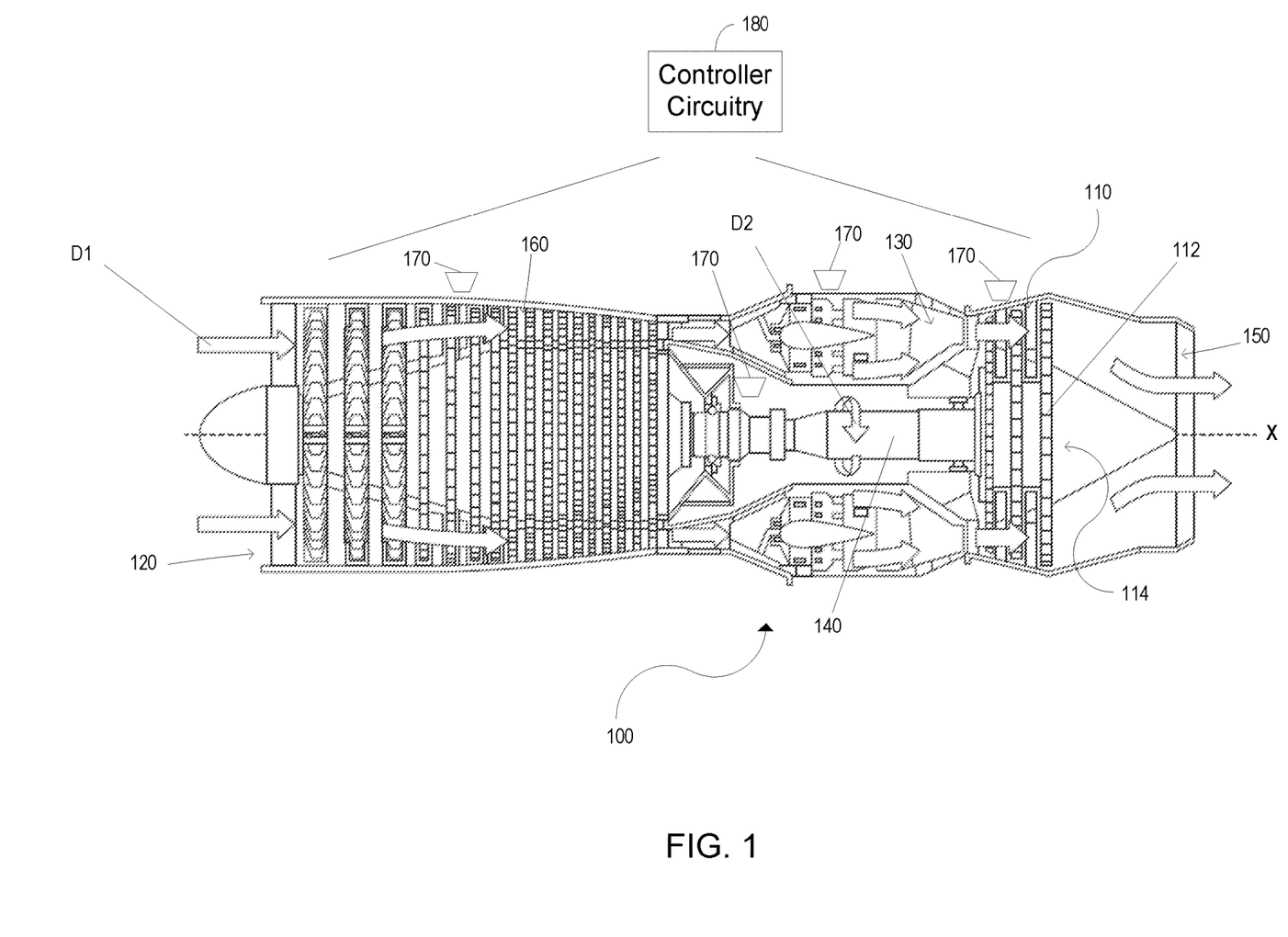
FIG. 1 illustrates a cross-sectional view of an example of a gas turbine engine.

FIG. 1 is a cross-sectional view of a gas turbine engine 100. In some examples, the gas turbine engine 100 may supply power to and/or provide propulsion of an aircraft. Examples of the aircraft may include a helicopter, an airplane, an unmanned space vehicle, a fixed wing vehicle, a variable wing vehicle, a rotary wing vehicle, an unmanned combat aerial vehicle, a tailless aircraft, a hover craft, and any other airborne and/or extraterrestrial (spacecraft) vehicle. Alternatively or in addition, the gas turbine engine 100 may be utilized in a configuration unrelated to an aircraft such as, for example, an industrial application, an energy application, a power plant, a pumping set, a marine application (for example, for naval propulsion), a weapon system, a security system, a perimeter defense or security system.

The gas turbine engine 100 may take a variety of forms in various embodiments. Though depicted as an axial flow engine, in some forms the gas turbine engine 100 may have multiple spools and/or may be a centrifugal or mixed centrifugal/axial flow engine. In some forms, the gas turbine engine 100 may be a turboprop, a turbofan, or a turboshaft engine. Furthermore, the gas turbine engine 100 may be an adaptive cycle and/or variable cycle engine. Other variations are also contemplated.

The gas turbine engine 100 may include an intake section 120, a compressor section 160, a combustion section 130, a turbine section 110, and an exhaust section 150. During operation of the gas turbine engine 100, fluid received from the intake section 120, such as air, travels along the direction D1 and may be compressed within the compressor section 160. The compressed fluid may then be mixed with fuel and the mixture may be burned in the combustion section 130. The combustion section 130 may include any suitable fuel injection and combustion mechanisms. The hot, high pressure fluid may then pass through the turbine section 110 to extract energy from the fluid and cause a turbine shaft of a turbine 114 in the turbine section 110 to rotate, which in turn drives the compressor section 160. Discharge fluid may exit the exhaust section 150.

As noted above, the hot, high pressure fluid passes through the turbine section 110 during operation of the gas turbine engine 100. As the fluid flows through the turbine section 110, the fluid passes between adjacent blades 112 of the turbine 114 causing the turbine 114 to rotate. The rotating turbine 114 may turn a shaft 140 in a rotational direction D2, for example. The blades 112 may rotate around an axis of rotation, which may correspond to a centerline X of the turbine 114 in some examples.

The gas turbine engine 100 may include any number of sensors 170, such as pressure, temperature, gas content, position, flow and other types of sensors providing operating parameters related to combustion and rotation of the gas turbine engine 100. The sensors 170 may be located at predetermined locations such that particular operating parameters may be sensed in the vicinity of the locations. In FIG. 1, sensors 170 are shown for illustrative purposes only and should not be construed as depicting size, location, or number of sensors 170 that may be present. The output of such sensors 170 may be provided to controller circuitry 180. The controller circuitry 180 and/or the sensors 170 may have circuitry that includes integrated circuits, such as semiconductors and/or other electronic parts and devices, such as resistors, capacitors, inductors, semiconductors, memory, diodes, and the like.

In some examples, a heat exchanger may be used to cool the integrated circuits, such as by some type of heat absorption, forced convection or other type of heatsinking methodology used to cool electronics. In other examples, the heat exchanger may be used to heat the integrated circuits, such as by some type of heat transfer, forced convection or other type of heat transfer methodology used to heat electronics. This cooling and/or heating method may, for example, use convection cooling/heating and cooling/heating fins to achieve the cooling/heating. Other example convection cooling/heating techniques may use forced convection with an external fan to increase a heat transfer coefficient. For convection cooling techniques, the heat transfer rate is governed by the heat transfer coefficient (h), and the effective area (A) of the heat exchanger. Equation 1 below notes this relationship for the possible temperature reduction (ΔT) that can be achieved with this type of cooling system. $Q\dot{}$ is the heat flux in W/m² for the heat exchanger. The heat transfer coefficients can range from about 5 to 100 Watts (W)/m² K for various configurations with air as the cooling medium.

$$Q\dot{} = hA\Delta T \qquad \text{Equation 1}$$

Another example type of heat transfer technique that may be used is a combination of forced convection and heat pipes to conduct the heat away from, or toward, the integrated circuit. In higher temperature zones with ambient temperatures ($T_{amb}$) in the range of 150 to 250° C., such as in an aerospace application, heat sinking techniques may have various shortcomings that make them unsuitable for cooling electronics to, for example, keep the integrated circuits device temperatures at or below a desired level such as Tjun≤110° C. Some of these weaknesses include:

1. Free air convection cooling techniques cannot cool the electronics below the ambient air temperature.
2. Forced and heat piped cooling requires large and bulky heat sinks and piping to cool the electronics with external air or cooling fluid.
3. Even with the addition of cooling pipes, the local temperature cannot be reduced much below the ambient temperature without significant energy input.
4. The forced and heat piped cooling techniques introduce more possible failure modes that must be managed for a reliable system, e.g. leak in cooling pipes, failure of cooling fan, mechanical failure, and the like.
5. These systems have cost, weight, packaging and reliability overhead.

Figure 2:
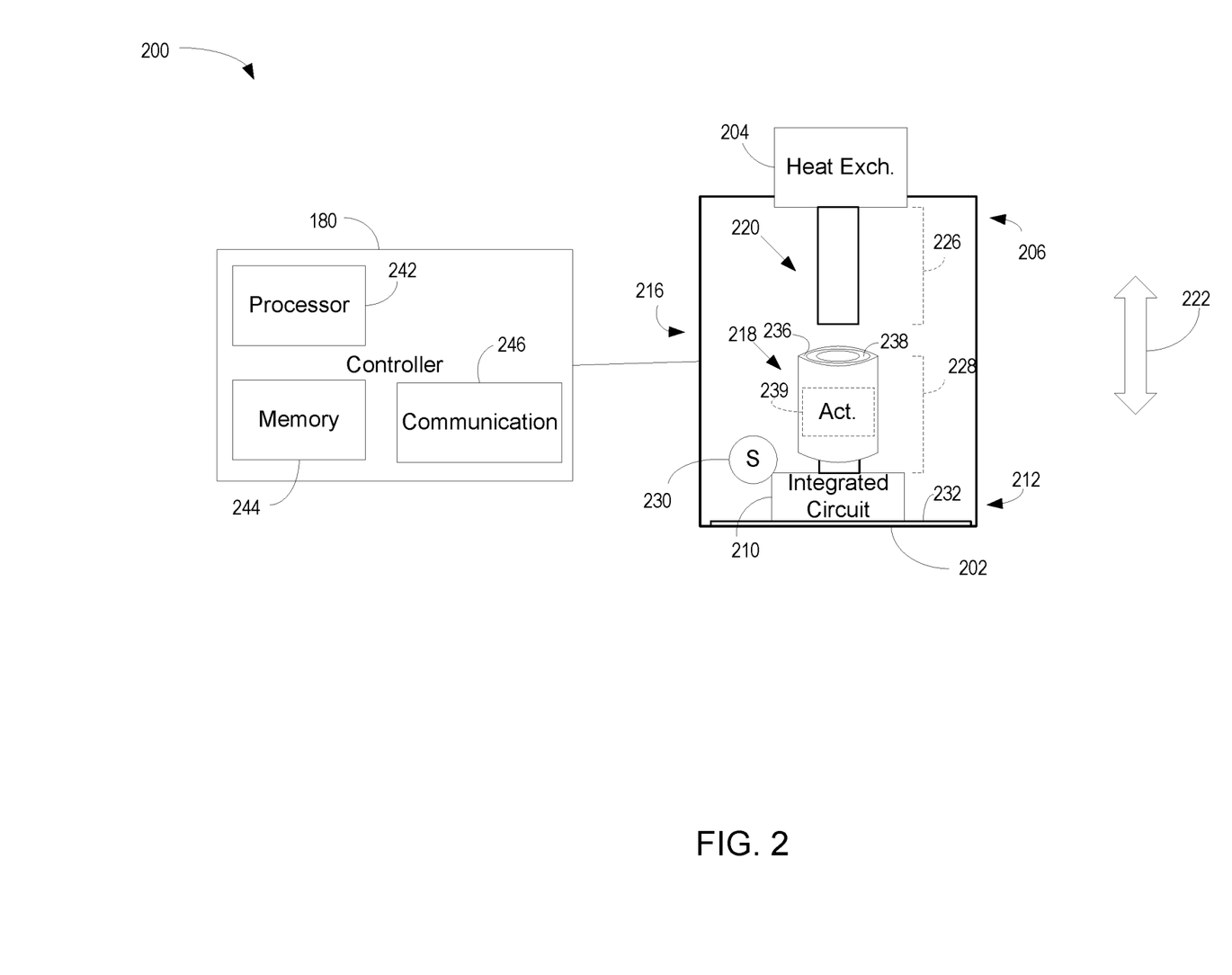
FIG. 2 illustrates a block diagram of an example of an integrated circuit thermal management system.

FIG. 2 is a an example block diagram of an integrated circuit (IC) thermal management system 200, which, as discussed herein, addresses several of the weaknesses of the heat transfer techniques using convection cooling and/or heating. In the example of FIG. 2, the IC thermal management system 200 includes an enclosure 202, and a heat exchanger 204, which may be positioned in, and/or on, a first side 206 of the enclosure 202. The IC thermal management system 200 may also include an integrated circuit 210 that includes electronic components, including semiconductors. The integrated circuit 210 may be positioned on a second side 212 of the enclosure 212, opposite the first side 206 of the enclosure 202. A slide 216 may be disposed in the enclosure 202. The slide 216 may include a moveable slide body 218 and a rail 220 upon which the slide body 218 may slide between the heat exchanger 204 and the IC 210 as illustrated by arrow 222. The body 218 may be positioned in a first position 226 at the first side 206 of the enclosure 202, and positioned in a second position 228 at the second side 212 of the enclosure 202. In the example of FIG. 2, the body 218 is positioned in the second position 228.

The enclosure 202 may be formed of a rigid material such as plastic, carbon fiber or metal to enclose and isolate the heat exchanger 204, integrated circuit 210 and the slide 216 from the electrical, thermal, liquid and mechanical environment external to the enclosure 202. In that regard, the enclosure 202 may be watertight and include thermal shielding from external heat sources and electromagnetic shielding such that a magnetic field generated within the enclosure 202 is substantially contained in the enclosure 202 and is not affected by the environment external to the enclosure 202. The heat exchanger 204, integrated circuit 210 and the slide 216 may be removeably installed in the enclosure 202 and accessible via an egress, such as a removeable panel or wall of the enclosure 202 for ease of manufacture, maintenance and repair. Accordingly, the heat exchanger 204, integrated circuit 210 and slide 216 may be coupled with the enclosure with fasteners that allow replacement or interchangeability of these components during repair maintenance or upgrades.

The heat exchanger 204 may be a heat dissipation device or system capable of absorbing thermal energy from within the enclosure 202 and dispersing such thermal energy outside the enclosure 202. In examples, the heat exchanger 204 may be a mechanical heat exchanger, a thermal electric heat exchanger or some combination, which may also include cooling and/or heating techniques using fluids, such as air or liquid. For example, the heat exchanger 204 may be a thermally conductive material mounted on, or forming one or more walls of the enclosure 202. Thus, in examples, the enclosure 202 may include integral thermo-electric layers in one or more walls of the enclosure 202 to actively cool the enclosure 202.

The integrated circuit 210 may be mounted in the enclosure 202 and electrically connected with devices and systems inside or outside the enclosure 202. The integrated circuit 210 may include a circuit board 232 or other mounting for semiconductors and other electronic devices. The integrated circuit may include one or more sensors 230, such as temperature sensors, which provide signals indicative of a current temperature of the integrated circuit 210, such as a temperature of one or more junctions of the integrated circuit 210.

The rail 220 may be one or more support members, such as a track, a truss, a beam, or other type of frame extending between the heat exchanger 204 and the integrated circuit 210 to which the body 218 is attached. Alternatively, the rail 220 may be a moveable conveyor, such as a carriage attached to the body 218 that is moveable to shuttle the body 218 between the heat exchanger 204 and the integrated circuit 210. The slide body 218 of the slide 216 may include an electromagnetic (EM) coil 236 and a magnetocaloric material (MCM) 238 positioned on the moveable slide body 218.

The EM coil 236 may an electrical conductor shaped as a coil, spiral, helix, or other shape having a centrally located aperture in which the MCM 238 may be positioned. When energized, the EM coil 236 may generate a magnetic field to which the MCM 238 is exposed. In addition, in some examples, the EM coil 236 may also have a dual purpose of initiating movement of the slide between the heat exchanger 204 and the integrated circuit 210. Thus, the EM coil 236 is configured to activate the MCM 238, and also configured to operate as a solenoid to moveably slide the MCM 238 on the slide body 218 between the heat exchanger 204 and the integrated circuit 210. Thus, the EM coil 236 is arranged with respect to the slide 216 and the MCM 238 to be energized by the controller circuitry 180 to form a magnetic field that moves the slide body 218 from the second position 228 to the first position 226, and also aligns the orientation of magnetic dipoles in the MCM 238.

In other examples, the IC thermal management system 200 may include a separate and independently operated actuator 239. The actuator 239 may be an electro mechanical system capable of reciprocating the slide 218 between the heat exchanger 204 and the integrated circuit 210. The actuator 239 may be operated electrically, such as a solenoid or motor, hydraulically, such as a piston or pump, mechanically, such as with a biasing member, or some combination. In the example configuration, that includes the actuator 239, the EM coil 236 is configured to activate the MCM 238 and the actuator 239 is configured to moveably slide the MCM 238 and the EM coil 238 between the heat exchanger 204 and the integrated circuit 210.

The MCM 238 may be an amorphous metal, such as black sand or silica, having properties capable of providing magnetic refrigeration in the absence of a crystalline structure present in other magnetic materials that are also metallic elements, such as Gadolinium alloy. The magnetic field provided by the EM coil 236 may control the entropy of the MCM 238. When the MCM 238 is not subject to the magnetic field, the atoms in the amorphous metal may be randomly arranged, thus giving the MCM 238 a higher resistivity (about three times higher) value than for crystalline structure magnetic material counterparts. In examples, structures which are usually crystalline, such as black sand and silica may be amorphized to make the magnetocaloric materials 238. These structures are crystalline however amorphous, similar to sand, which is crystal but there are many and therefore not pure crystal. The crystals in the material can be aligned with a field while contained in one or more material blocks. Because of the absence of a well-defined lattice or crystalline structure, the amorphous alloy of the MCM 238 may be magnetically soft (lower coercivity, lower core loss, higher permeability, etc.) and the magnetic domains of the MCM 238 may be aligned under relatively lower magnetic fields than those required for crystalline magnetic structures. Due to the higher resistivity of the MCM 238, the MCM 238 provides lower core loss at higher frequencies.

The presence of a magnetic field around the amorphous metal of the MCM 238 constrains and aligns the orientation of magnetic dipoles in the MCM 238 with a resulting increase in temperature of the MCM 238. Increasing the strength of the magnetic field results in more dipole alignment, and effectively enables the refrigerant to enter a lower entropy state with lower heat capacity. As more and more of the dipoles are aligned, internal degrees of freedom are reduced resulting in the heat capacity of the amorphous material of the MCM 238 continuing to diminish as the temperature of the MCM 238 correspondingly increases. In the case of cooling an integrated circuit, the increased temperature of the MCM 238 may be dissipated by contact with a cooler object, such as the heat exchanger 204. Thus, by keeping the MCM 238 in contiguous thermal contact with the heat exchanger 204 while the MCM 238 is subject to the magnetic field of the energized EM coil 236, the MCM 238 loses some energy as generated heat energy, which is dissipated until the MCM 238 reaches an equilibrium temperature with the heat exchanger 204. Alternatively, or in addition, in the case of heating the integrated circuit 210, the temperature of the MCM 238 may be increased by contact with a hotter object, such as the heat exchanger 204. Thus, by keeping the MCM 238 in contiguous thermal contact with the heat exchanger 204 while the MCM 238 is not subject to the magnetic field of the energized EM coil 236, the MCM 238 gains heat energy, until the MCM 238 reaches an equilibrium temperature with the heat exchanger 204. Then, the MCM 238 may be moved into contiguous thermal contact with the integrated circuit 210 while the MCM 238 is subject to the magnetic field of the energized EM coil 236 resulting in the MCM 238 generating heat energy which is sourced to the integrated circuit 210 in addition to the heat energy absorbed from the heat exchanger 204.

When the magnetic field of the EM coil 236 is subsequently de-energized, (the changing movement of the magnetic field stops), the heat capacity of the MCM 238 rises again because the degrees of freedom associated with orientation of the dipoles are once again liberated, pulling their share of equipartitioned energy from the motion of the molecules, thereby lowering the overall temperature of the MCM 238 system with decreased energy. When the MCM 238 is move away from thermal communication with the heat exchanger 204 prior to the magnetic field being de-energized, the MCM 238 system is insulated when the magnetic field is switched off, making the process adiabatic, i.e., the system can no longer exchange energy with its surroundings (e.g. the heat exchanger 204), and the temperature of the MCM 238 decreases below the temperature of equilibrium with the heat exchanger 204.

The IC thermal management system 200 may also include controller circuitry 180. Controller circuitry 180 may include one or more processors 242 executing instructions stored in memory 244. The circuitry of the controller 180 may include executable logic stored in memory 244 to provide at least a portion of the functionality described herein. The processor 242 may include communication circuitry 246 to provide signal input/output capability for communication with the integrated circuit(s) 210, the slide 216, sensor(s) 230 and/or other devices associated with enclosure 202. The processor 242 may also be in communication with sensors and devices associated with the gas turbine engine 100 (FIG. 1). The controller 180 may receive parameters, such as operational values related to combustion of the gas turbine engine via the communication circuitry 246. In addition, the controller 180 may output parameters and control commands via the communication circuitry 246 to the integrated circuit(s) 210, the slide 216, sensor(s) 230 and/or other devices associated with enclosure 202, and also devices and systems associated with the gas turbine engine 100. Communication via the communication circuitry 246 may be wired or wireless, and may be in the form of individual signals, groups of signals, network communication protocols, proprietary protocols and/or other forms of electronic based messaging or signal transmission.

Referring to FIGS. 1 and 2, operation of the gas turbine engine 100 may be controlled with one or more controllers, such as electronic control units (ECU), and/or full authority digital engine control (FADEC) units. The controller 180 may receive input parameters, such as operational parameters sensed by sensors included in the compressor section 160, the combustion section 130, the turbine section 110, and/or the exhaust section 150 on the gas turbine engine 100 associated with combustion. Operational parameters received by the controller 170 may also include operational inputs from other controllers and devices present in the gas turbine engine 100, such as engine speed, vane tip clearance and the like. In addition, the controller 170 may output control signals to the gas turbine engine 100 and other devices.

During operation, the controller 180 may control energization of the magnetic coil 236 and movement of the MCM 238 on the slide body 218 between the heat exchanger 204 and the integrated circuit 210 based on the temperature signal from the sensor 230 in order to control the temperature of the integrated circuit(s) 210 by extracting heat therefrom. The controller 180 may intermittently and sequentially move the slide 218 and energize/de-energize the EM coil 236 based on a predetermined setpoint. For example, when the temperature of the integrated circuit 210 reaches 85° C.-90° C., the slide 218 may be moved to the second position 228 to be in thermal communication with the integrated circuit 210, and the EM coil 236 may be de-energized such that the MCM 238 cools. Upon the MCM 238 no longer cooling the integrated circuit 210, the slide 218 may be moved to the first position 226 such that the MCM 238 is in thermal communication with the heat exchanger 204, and the EM coil 236 may be energized thereby causing the MCM 238 to increase in temperature. In examples, the controller circuitry 180 may monitor a temperature of the MCM 238, the heat exchanger 204, or both using appropriately positioned temperature sensors to control the position of the slide 218 and the generation of the magnetic field by the EM coil 236. In other examples, predetermined times, or only the integrated circuit 210 temperature may be used to control movement and heating/cooling.

In examples, The MCM 238 may be in thermal communication with the integrated circuit(s) 210 by contiguous contact. Alternatively, or in addition, the enclosure 202 may include integral cooling and/or heating features, such as cooling and/or heating channels around the internal surfaces of the enclosure 202 and/or integral heat pipes that may provide thermal communication between the MCM 238 and the integrated circuit 210 in order to extract heat from integrated circuit 210 or source heat into the integrated circuit 210. Using the cooling and/or heating channels, integral heat pipes and/or the MCM 238 directly, the junction temperature of the integrated circuit 210 within the enclosure 202 may be maintained in a predetermined range below a predetermined value, such as maintained below 75° C. by the controller 180 to maximize the life span and minimize the failure rate of the integrated circuit 210.

In addition, since thermal management by the controller 180 may closely regulate the temperature of the integrated circuit(s) 210, the solder joint life may also be improved as the solder joints will not be subject to creepage and cold flow types of joint failures due to higher temperature variation in operation. In these configurations, the heat transfer from the IC thermal management system 200 is adiabatic, and the potential change in temperature $\Delta TAD$ is proportional to the change in magnetic entropy of the amorphous material, ΔSME. Included in the MCM 238. In this type of controlled refrigeration process it is possible to reduce the temperature of the MCM 328 to single digit Kelvin temperatures if sufficient energy is applied to drive the process. In example applications, the range of temperature change of the MCM 238 may be 30° C. to 50° C.

Figure 3:
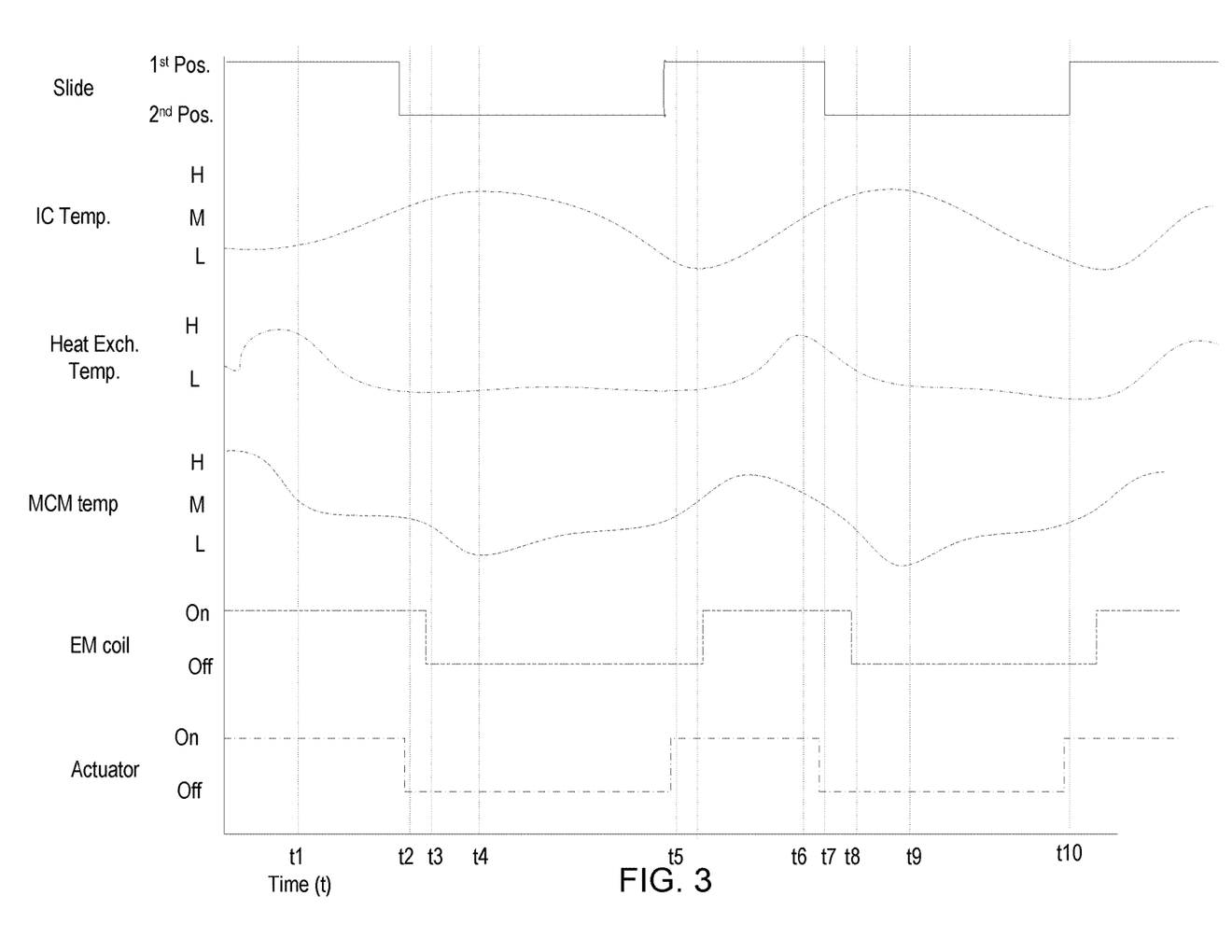
FIG. 3 is a logic diagram illustrating an example operational sequence of the IC thermal management system.

FIG. 3 is a logic diagram illustrating an example operational sequence of the IC thermal management system 200. The operational sequence may be controlled by the controller circuitry 180 to provide IC cooling. In other examples, IC heating may be controlled by the operational sequence of the controller circuitry 180. In the example of FIG. 3, and with reference to FIG. 2, the IC thermal management system 200 includes a separate EM coil 236 to generate the magnetic field, and an actuator 239 to move the slide 218. In other examples, the EM coil 236 may generate the magnetic field and move the slide 218, and the actuator 239 may be omitted. The operational sequence begins at time t1 with slide 218 in the first position 226 and the IC 210 temperature low (L) with the actuator 239 on, and the EM coil 236 on. The temperature of the MCM 238 is dropping due to thermal communication with the heat exchanger 204, which has absorbed the heat energy from the MCM 238 and subsequently dissipates the heat energy absorbed by convection as described elsewhere. At time t2, the measured temperature of the IC 210 increases to a threshold value (M) and the actuator 239 is turned off thereby moving the slide 218 to the second position 228.

The EM coil 236 is subsequently turned off at t3, which cause the temperature of the MCM 238 to further decrease. The temperature of the IC 210 begins to decrease and the MCM 238 temperature begins to correspondingly increase due to thermal communication with the MCM 238 at t4. At t5, the temperature of the MCM 238 has increased to the point (M) where the cooling effect on the IC 210 is diminished, and the actuator 239 is energized to move the slide 218 back to the first position 226 in thermal communication with the heat exchanger 204. In other examples, energization to move the slide 218 may be based on, for example, at least one operational parameter received from the gas turbine engine, such that the controller circuitry 210, in response to the at least one operational parameter, is configured to initiate movement of the slide 218 from the second position 228 to the first position 226, and energization of the EM coil 236.

At t6, the EM coil 236 is energized and the MCM 238 correspondingly increases in temperature (H) as the dipoles come into alignment in the magnet field being generated. At t7, the heat exchanger 204 absorbs and subsequently dissipates the heat energy generated by the MCM 238 and the actuator 239 is de-energized to move the slide 218 to the second position 228 in thermal communication with the IC 210 as the temperature on the IC 210 increases to the threshold (M). Thus, the controller may energize the EM coil 236 while the slide 218 is at the first position 226 and deenergize the EM coil 236 while the slide 218 is at the second position 228. In other examples, de-energization to move the slide 218 may be based on, for example, at least one operational parameter received from the gas turbine engine.

The EM coil 236 is de-energized at t8, and the temperature of the MCM 238 is further reduced (L) at t9 resulting in the temperature of the IC 210 decreasing below the threshold (M). At t10, the actuator 239 is energized to move the slide 218 back to the first position 226 such due to the MCM 238 increasing in temperature to the point (M) where the cooling effect on the IC 210 is diminished, and the temperature of the IC 210 subsequently begins to rise. In other examples the slope of increasing and decreasing temperatures as well as the energization and de-energization may be different. The cycle may repeat indefinitely as the IC 210 increases in temperature to the threshold. The frequency of the cycle may result in a relatively high frequency oscillation of the slide 218 that coincides with the heating and cooling cycle of the MCM 238 to maintain the temperature of the IC 210 in a desired range. Similar examples are possible using an operational sequence of IC heating using heat transferred from the heat exchanger 204 via the MCM 238, and heat generated by the MCM 238 when subject to the electromagnetic field generated by the energized EM coil 236.

Figure 4:
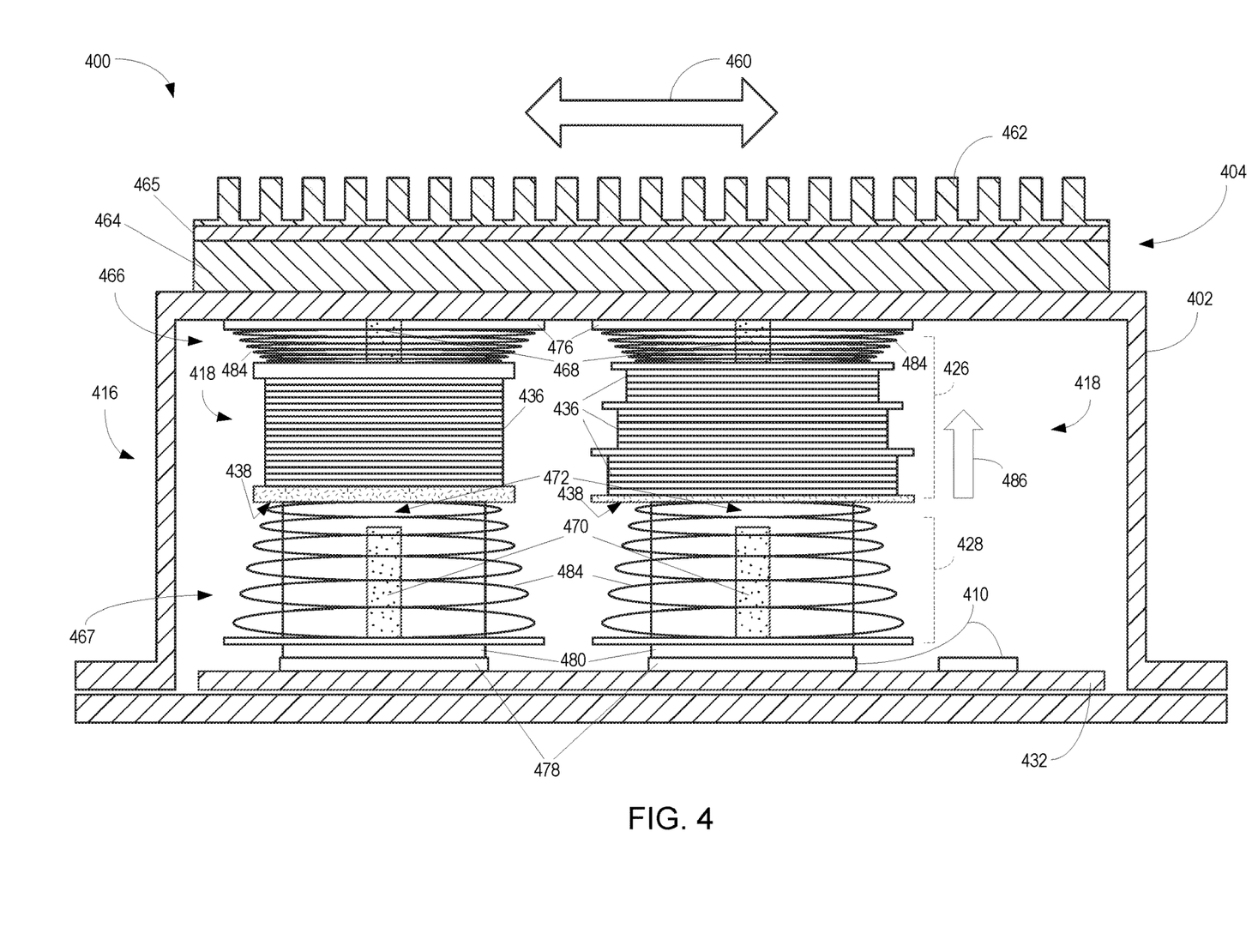
FIG. 4 illustrates a schematic diagram example of portions of an integrated circuit thermal management system.

FIG. 4 is a cross-sectional view of a portion of an example IC thermal management system 400. The illustrated portion of the IC thermal management system 400 includes an enclosure 402, a heat exchanger 404, multiple integrated circuits 410, and multiple slides 416 which are positioned in the first position 426 such that the MCM 438 is in thermal communication with the heat exchanger 404. For purposes of brevity the discussion will focus on the differences with the other embodiments described, and all features, functionality and operation described herein is fully interchangeable, enabled and useable with the different example embodiments, unless otherwise noted.

In the example of FIG. 4, the heat exchanger 404 may provide cooling by convection of heat energy into an air flow 460 of cooling air, such as from the gas turbine engine, across fins 462 included on the heat exchanger 404. In this example, the heat exchanger 404 is mounted external to the enclosure 402 by being coupled to an external wall of the enclosure 402 with a thermally conductive compound 464 that can absorb thermal energy relatively quickly, such as aluminum, and a thermal transfer paste 465 providing thermal communication with MCM 438 included on the slides 416. In other examples, the heat exchanger 404 may provide heating of the MCM 438 by convection of heat energy received in the hot air flow 460.

The MCM 438 may be in thermal communication with thermal landings in the first position 426 and in the second position 428, such as a first thermal landing 466 included with the heat exchanger 404, and a second thermal landing 467 included with the IC 410. The MCM 438 may directly contiguously contact the first thermal landing 466 in the first positon 426, or may be in thermal communication with the first thermal landing 466 via other structure(s), such as the slide 416. Similarly, in the second position 428, the MCM 438 may contiguously contact the second thermal landing 467, or the MCM 438 may be in thermal communication with the second thermal landing 467 via other structure(s), such as the slide 416.

The first thermal landing 466 may include a first heat pipe 468 contiguously contacting and extending away from the heat exchanger 404, and the second thermal landing 467 may include a second heat pipe 470 contiguously contacting and extending away from the integrated circuit 410 toward the first heat pipe 468 such that a gap 472 is formed between the first heat pipe 468 and the second heat pipe 470. The gap 472 ensures that heat energy in one of the heat pipes is not transferred to the other heat pipe. The MCM 438 may be in direct or indirect thermal communication with the respective heat pipes 468 or 470 according to whether the slides 416 are in the first position 426 or the second position 428. In an example, the slides 416 are aligned to reciprocate between the first position 426 and the second position 428 on a rail, that is formed by the first heat pipe 468 being axially aligned with the second heat pipe 470 with the gap 472 there between.

The EM coil 436 and MCM 438 may be positioned on the respective slides 416 to be in thermal communication with the heat pipes 468 or 470 according to the position of the slides 416. Thus, the MCM 438 is in thermal communication with the first heat pipe 468 only when the MCM 438 and the EM coil 436 are moved into the first position 426 closer to the heat exchanger 404 and the MCM 438 is in thermal communication with the second heat pipe 470 only when the MCM 438 and the EM coil 436 are moved to the first position 428 closer to the IC 410.

Alternatively, or in addition, the thermal landings 466 and 467 may include thermally conductive surfaces in the form of a first thermal conductive surface 476 of the heat exchanger 404, and a second thermal conductive surface 478 of the IC 410. The first and second thermal conductive surfaces 476 and 478 may be positioned such that the MCM 438, or the slides 416, or both, are in thermal communication when the slides 416 are in the respective first and second positions 426 and 428. Thermal communication between the first thermal conductive surface 476 and the slides 410 and/or the MCM 438 may be facilitated by a thermal paste there between. In addition, thermal communication between the second thermal conductive surface 478 and the slides 410 and/or the MCM 438 may be facilitated by a deformable thermal paste 480 with shock absorbing properties such that the thermal past 480 is a deformable, such as rubber-like. In this way, when the slides 410 slide into contact with the respective IC's 410, the shock absorbing properties of the deformable thermal past 480 may minimize damage to the ICs 410. Also, where the ICs 410 are mounted on a circuit board, such as a printed circuit board (PCB), damage to the circuit board may similarly be minimized.

In the example of FIG. 4, each of the slides 416 includes at least one deformable member 484 in the form of an elastic object capable of storing mechanical energy when deformed. The deformable member(s) 484 may be biased to hold the MCM 438 in thermal communication with the heat exchanger 404 or the IC 410. The deformable member 484 may have a resting memory position that creates the bias when the deformable member 484 is deformed. For example, when subject to force in a predetermined direction, the deformable member 484 may be moved, or deformed, from its resting memory position and store mechanical energy. Upon the force in the predetermined direction being removed or reduced, the deformable member 484 itself supplies the stored mechanical energy as a return force to move the deformable member 484 back to its resting memory position. For example, a deformable member 484 may be coupled with the slide 416 and aligned therewith so as to have a resting memory position that biases and aligns the slide 416 with the second position 428, and the magnetic field that moves the slide 416 from the second position 428 to the first position 426 also deforms the deformable memory 484 away from the resting memory position.

Each of the slides 416 in the example of FIG. 4, include deformable members 484 in the form of springs, which may be coupled between the slide 416 and the heat exchanger 404, and between the slide 416 and IC 410. The deformable members 484 may be used to minimize the energy needed to oscillate the slide 416 between the first position 426 and the second position 428. In addition, the deformable members 484 may be biased such that the at rest position is when the slide 410 is in the first position 426 or the second position 428. In FIG. 4, the slides 416 are illustrated in the first position 426, and are biased by the deformable members 484 to have a rest position in the second position 428. Accordingly, when the EM coil 436 is de-energized, or the actuator 439 is de-energized (if present), the deformable members on the heat exchanger side of the slide 416 will move the slide 416 into the second position 428. The multiple EM coils 436 illustrated may be pulsed by the controller circuitry at a high frequency to correspondingly oscillate or reciprocate the slides 416 at high frequency to draw heat energy out of the second thermal landing 467 and provide heat into the first thermal landing 466 to thus cool the ICs 410 via a magnetically controlled heatpump. Alternatively, or in addition, the multiple EM coils 436 may be pulsed by the controller circuitry at a high frequency to correspondingly oscillate or reciprocate the slides 416 at high frequency to draw heat energy out of the first thermal landing 466 and provide heat into the second thermal landing 467 to thus heat the ICs 410 via a magnetically controlled heatpump As illustrated in FIG. 4, the body 418 of the left side slide 416 includes a single EM coil 436 and the body 418 of the right side slide 416 includes a series of three cascaded EM coils 436. In other examples fewer or greater numbers of EM coils 436 may be cascaded. The series of cascaded EM coils 436 may be controlled by the controller circuitry to selectively generate a respective magnetic field to accelerate the heat transfer that is achieved with only one EM coil 436. In this configuration, the series of cascaded coils are energized sequentially to move the amorphous material in the MCM 438 along the heat pipe 468 in a desired direction to enable a higher heat transfer rate. Accordingly, when the slide 416 is in the first position 426, the amorphous material in the MCM 438 may be moved toward the heat exchanger 404 by sequential energization of the EM coils 436 in the direction of arrow 486.

In FIG. 4, there are multiple ICs 410 being independently cooled and/or heated by different, and spaced apart MCM 438 included on respective independent and spaced apart bodies 418. Each of the ICs 410 may include a temperature sensor used by the controller circuitry to control the movement (oscillation position) of the body 418 on the slide 416 between the first position 426 and the second position 428, and control generation of the magnetic field by the EM coil(s) 436. Alternatively, or in addition, the controller circuitry may control movement of the slides 418 between the first position 426 and the second position 428 in predetermined groups (or group) based on a representative temperature reading from the group, as well as, for example, based on operational parameters of a gas turbine engine in which the system is operating. For example, the controller circuitry may monitor the temperature signals from temperature sensors of ICs 410 in a predetermined group, and operate the IC thermal management system according to any one of the monitored temperatures reaching a predetermined threshold.

Figure 5:
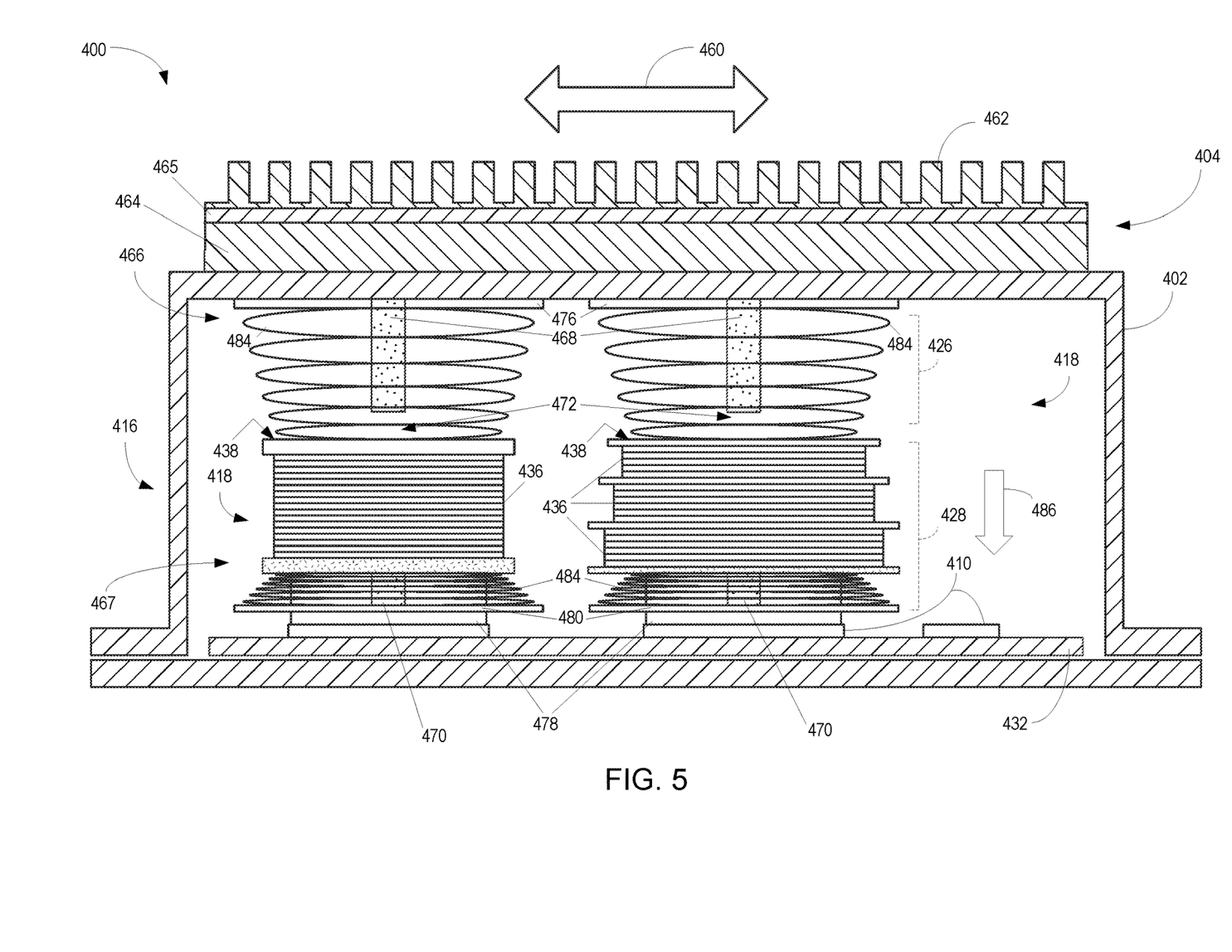
FIG. 5 illustrates another schematic diagram of the example portions of the integrated circuit thermal management system illustrated in FIG. 4.

FIG. 5 is another cross-section view of a portion of the example IC thermal management system 400 of FIG. 4. In FIG. 5, the slides 416 are illustrated in the second position 428 such that the MCM 438 is in thermal communication with the ICs 410. As is illustrated, the bodies 418, and therefore the MCM 438 may have moved across the gap 472, such the MCM 438 is in thermal communication with a respective IC 410 via the second thermal landing 467.

During example operation, controller circuitry included in the integrated circuit thermal management system 400 may operate the slide 416 to be moveable between the first position 426 and the second position 428. The heat exchanger 404 is positioned at the first position 426 and the integrated circuit 410 is positioned at the second position. The electromagnetic coil 436 and the MCM 438 are disposed on the slide, such that the MCM 438 is positioned within the EM coil 436. One or more sensors may be positioned to sense the operating temperature(s) of the respective integrated circuits 410 being sensed. The controller circuitry may execute instructions stored in memory to receive a temperature signal from the sensor indicative of the sensed operating temperature, to control movement of the slide 416 between the first position 426 and the second position 428. In addition, the controller circuitry may control energization of the electromagnetic coil such that heat from the MCM 438 is transferred to the heat exchanger 404 (electromagnetic field on) or heat from the integrated circuit 410 is transferred to the MCM 238 (electromagnetic field off) according to the sensed operating temperature during an integrated circuit cooling mode. In addition, or alternatively, the controller circuitry may control energization of the electromagnetic coil such that heat from the heat exchanger 404 is transferred to the MCM 438 (electromagnetic field off) or heat from the MCM 438 (electromagnetic field on) is transferred to the integrated circuit 410 according to the sensed operating temperature during an integrated circuit heating mode.

Figure 6:
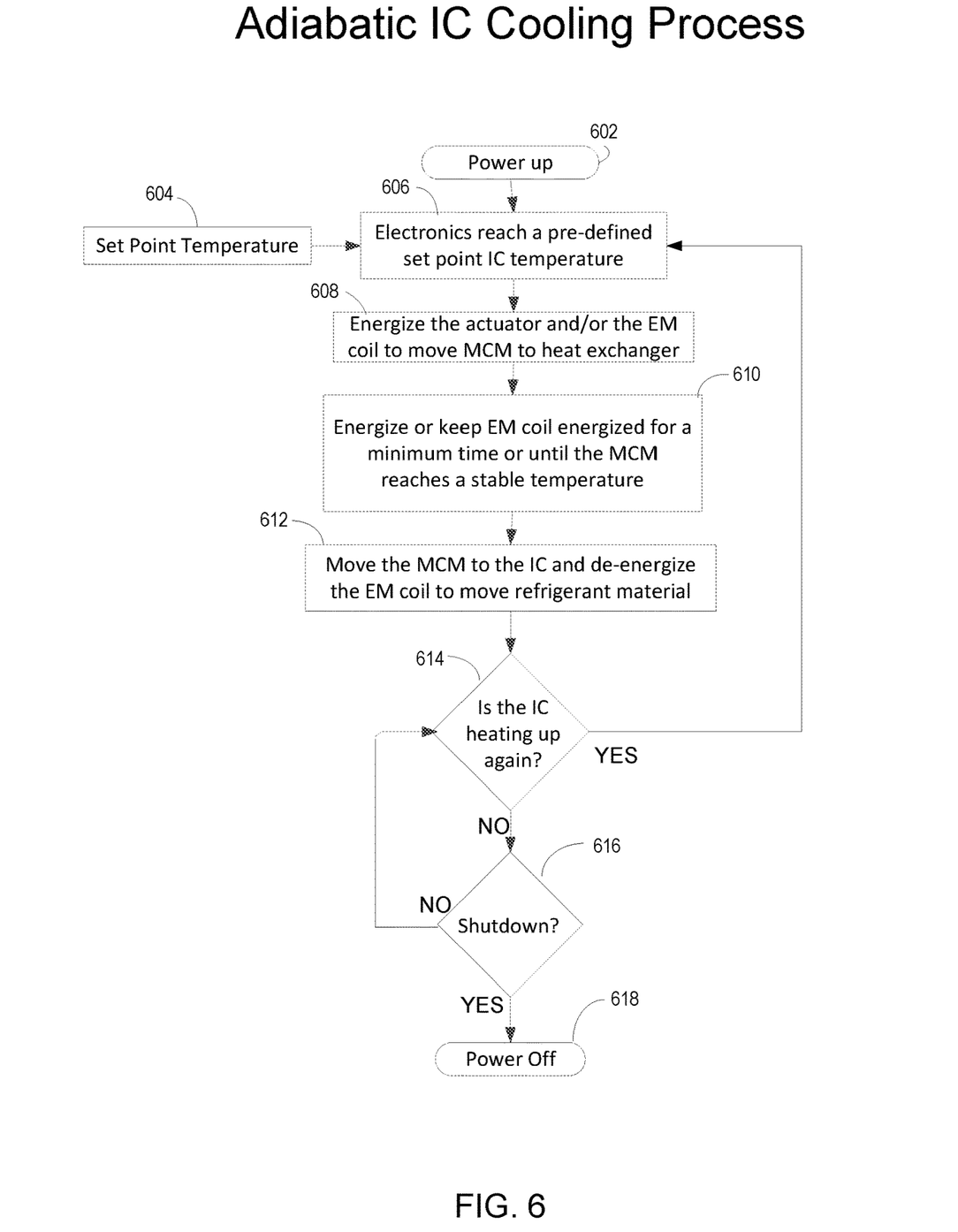
FIG. 6 is an example logic flow diagram of an integrated circuit thermal management system.

FIG. 6 is an operational flow diagram illustrating example operation of the IC thermal management system. The described example operation is an adiabatic magnetocaloric cooling process. In other examples, the operation may be an adiabatic magnetocaloric heating process. With reference to FIGS. 1-5, the operation is initiated after power up of the IC thermal management system 200 and 400. (602) Power up may occur manually, or automatically, such as in connection with the initialization of startup of the gas turbine engine. Automatic power up may be based on a power up command received via the communication circuitry 246. The power up command may be a separate command to the controller circuitry 180, and/or may be based on operational parameters received by the controller circuitry 180 via the communication circuitry 246.

After power up, the controller circuitry 180 may retrieve a set point temperature stored in memory 244 (604), and monitor for electronics within the structure 202, including integrated circuit 210, to reach the retrieved set point temperature. (606) The controller circuitry 180 may energize the actuator (if present) and/or the EM coil 236 and 436 to move the MCM 238 and 438 into thermal communication with the heat exchanger. (608) By energizing the EM coil 236 and 436, the magnetocaloric material 238 and 438 is pulled toward the heat exchanger 204 and 404 making contact with the heat exchanger 204 and 404 via the first thermal landing 266 and 466, such as directly or through the first heat pipe 268 and 468. Due to the gap 272 and 472, thermal communication is only with the first thermal landing 266 and 466 when the slide body 218 and 416 is in the first position 226 and 426. If an actuator 239 and 439, such as a solenoid is used to move the slide body 218 and 416 to the first position 226 and 426, the same action may be implemented by independently energizing the actuator 239 and 439. As described elsewhere, it is the EM coil 236 and 436 around the magnetocaloric material 238 and 438 that will produce a magnetic field that affects the refrigerant material to heat it up.

The EM coil 236 and 436 may be energized for a predetermined time period, until a predetermined or stable temperature of the MCM 238 and 438 is reached, or a predetermined temperature of the MCM 238 and 438 is achieved. (610) The stable temperature may be when thermal balance with the heat exchanger 204 and 404 is reached. The slide body 218 and 416 that includes the EM coil 236 and 436 and the MCM 238 and 438 is moved from the first position 226 and 426 to the second position 228 and 428 by de-energization of the actuator 239 and 439 (if present) and/or the EM coil 236 and 436. (612) In some examples, since the deformable member 484 on the heat exchanger side of the slide body 218 and 416 has a stronger resting memory position than the deformable member 484 on the IC side, the slide body 218 and 416 will be moved to the second position to place the MCM 238 and 438 in thermal communication with the IC 210 and 410 via, the second thermal landing 267 and 467, such as, the second heat pipe 270 and 470. Due to the gap 272 and 472, thermal communication is only with the second thermal landing 267 and 467 when the slide body 218 and 416 is in the second position 228 and 428.

While the IC 210 is being cooled by the MCM 238 and 438, the controller circuitry 180 monitors the temperature of the IC 210 and 410 to determine if the temperature begins to increase. (614) If the temperature of the IC 210 begins to increase, the controller circuitry 180 returns to monitoring for the temperature to reach the retrieved setpoint. (606) Alternatively, if the IC 210 and 410 is not increasing in temperature the controller circuitry determines whether to shutdown the IC thermal management control system 200 and 400. (616) Shutdown of the IC thermal management system 200 and 400 may be determined by the controller circuit 180 based on, for example, a predetermined time that the IC 210 and 410 does not increase in temperature, operational parameters from the gas turbine engine, some combination thereof, or other indication that the gas turbine engine is not operating and/or the temperature of the IC 210 and 410 is stable and not expected to increase. If the controller circuitry 180 determines not to shutdown at this time, the controller circuitry 180 returns to monitoring for an increase in the IC 210 and 410 temperature. If the controller circuitry 180 determines that a shutdown is appropriate, based on, for example, a manual shutdown command, or a logically generated command based on operational parameters of signals received via the communication circuitry 246. Once shutdown is determined or commanded, the controller circuitry 180 may power off the IC temperature control system. (618) The controller circuitry 180 may then monitor for another power up event. (602)

The integrated circuit thermal management system may be implemented in many different applications. In association with operation of a gas turbine engine, the integrated circuit thermal management system may be used to advantageously locate electronics in areas within the vehicle or system using the gas turbine engine that would otherwise not be feasible due to excessive environmental temperatures. Thus, the integrated circuit thermal management system overcomes technical challenges to provide many technical advantages, including:

1. Active cooling and/or heating of electronics and integrated circuits in enclosed locations with relatively high and/or low ambient temperatures.
2. Improved reliability of the electronics and integrated circuits being cooled and/or heated.
3. Minimized moving parts, no liquids or gases, etc. in enclosures with electronic components, self-sustaining, no expended materials or by products.
4. Weight reduction compared to other forms of IC cooling/heating systems.

5. Enabler for optical, cyber and security module technology—reduced integrated circuit junctions and ambient temperatures to allow COTS or MIL electronics to be integrated.
6. Enabler for distributed controls where integrated circuits may be positioned in areas of extreme hot and cold temperatures.
7. Greener refrigeration and/or heating system without environmentally damaging gases such as Freon, etc. . . . .

The methods, devices, processing, circuitry, and logic described herein may be implemented in many different ways and in many different combinations of hardware and software. For example, all or parts of the implementations may be controller circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

Components of the IC thermal management system and/or the gas turbine engine described herein may include additional, different, or fewer components. For example, the controller circuitry may include multiple processors that are distributed within a network included in a vehicle in which the gas turbine engine operates. In addition, the features and functionality of the integrated circuit thermal management system described herein may include additional, different, greater or fewer operations than illustrated and/or discussed. In addition, the operations illustrated may be performed in an order different than illustrated.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

A first aspect relates to an integrated circuit thermal management system comprising:
 an enclosure;
 a heat exchanger positioned on a first side of the enclosure;
 an integrated circuit positioned on a second side of the enclosure;
 a temperature sensor configured to generate a temperature signal indicative of a temperature of the integrated circuit;
 a slide disposed in the enclosure and extending between the heat exchanger and the integrated circuit, the slide comprising a moveable slide body;
 an electromagnetic coil and a magnetocaloric material positioned on the slide body; and
 a controller configured to control energization of the electromagnetic coil and movement of the magnetocaloric material on the slide between the heat exchanger and the integrated circuit based on the temperature signal.

A second aspect relates to the integrated circuit thermal management system of aspect one, wherein the electromagnetic coil is configured to activate the magnetocaloric material and moveably slide the magnetocaloric material on the slide between the heat exchanger and the integrated circuit.

A third aspect relates to the integrated circuit thermal management system of aspect one or two, further comprising a solenoid, the electromagnetic coil configured to activate the magnetocaloric material and the solenoid configured to moveably slide the magnetocaloric material and the electromagnetic coil between the heat exchanger and the integrated circuit.

A fourth aspect relates to the integrated circuit thermal management system of any preceding aspect, further comprising a first heat pipe contiguously contacting and extending away from the heat exchanger, and a second heat pipe contiguously contacting and extending away from the integrated circuit toward the first heat pipe to provide a gap between the first heat pipe and the second heat pipe.

A fifth aspect relates to the integrated circuit thermal management system of aspect 4, wherein the slide is aligned to reciprocate the slide body on a rail between the heat exchanger and the integrated circuit, the rail comprising the first heat pipe axially aligned with the second heat pipe, with the gap therebetween.

A sixth aspect relates to the integrated circuit cooling system of aspect 4, wherein the magnetocaloric material is in thermal communication with the first heat pipe only when the magnetocaloric material and the electromagnetic coil are moved closer to the heat exchanger and the magnetocaloric material is in thermal communication with the second heat pipe only when the magnetocaloric material and the electromagnetic coil are moved closer to the integrated circuit.

A seventh aspect relates to the integrated circuit thermal management system of any preceding aspect, further comprising a deformable member that is biased to maintain thermal communication between the magnetocaloric material and the heat exchanger or is biased to maintain thermal communication between the magnetocaloric material and the integrated circuit.

An eighth aspect relates to an integrated circuit thermal management system comprising:
   a slide comprising a slide body moveable between a first position and a second position;
   a heat exchanger positioned at the first position;
   an integrated circuit positioned at the second position;
   an electromagnetic coil disposed on the slide body;
   a magnetocaloric material disposed on the slide body and positioned within the electromagnetic coil;
   a sensor positioned to sense an operating temperature of the integrated circuit; and
   controller circuitry configured to execute instructions stored in memory to:
      receive a temperature signal from the sensor indicative of the sensed operating temperature; and
      control movement of the slide body between the first position and the second position and energization of the electromagnetic coil such that heat from the magnetocaloric material is transferred between the heat exchanger and the magnetocaloric material or heat from the integrated circuit is transferred between the magnetocaloric material and the integrated circuit according to the sensed operating temperature.

A ninth aspect relates to the integrated circuit thermal management system of aspect 8, wherein the controller circuitry is configured to energize the electromagnetic coil while the slide body is at the first position and deenergize the electromagnetic coil while the slide body is at the second position.

A tenth aspect relates to the integrated circuit thermal management system of any preceding aspect, wherein the heat exchanger includes a first thermal landing, and the integrated circuit includes a second thermal landing, and at least one of the magnetocaloric material or the slide body contiguously contact the first thermal landing in the first positon, and contiguously contact the second thermal landing in the second position.

An eleventh aspect relates to the integrated circuit thermal management system of aspect 10, wherein the first thermal landing comprises a first heat pipe extending away from the heat exchanger to contact the at least one of the magnetocaloric material or the slide body in the first position, and the second thermal landing is a second heat pipe extending away from the integrated circuit toward the first heat pipe to contact the at least one of the magnetocaloric material or the slide body in the second position, and the first heat pipe and the second heat pipe extending towards each other to create a gap therebetween.

A twelfth aspect relates to the integrated circuit thermal management system of aspect 10, wherein the first thermal landing comprises a first thermally conductive surface of the heat exchanger comprising a thermal paste, and the second thermal landing comprises a second thermally conductive surface of the integrated circuit, wherein the second thermally conductive surface comprises a thermal transfer paste with shock absorbing properties.

A thirteenth aspect relates to the integrated circuit thermal management system as in any of the preceding aspects, further comprising a solenoid, the solenoid energized and deenergized by the controller circuitry to move the slide body between the first position and the second position.

A fourteenth aspect relates to the integrated circuit thermal management system as in any preceding aspect, wherein the electromagnetic coil is arranged with respect to the slide and the magnetocaloric material to be energized by the controller circuitry and form a magnetic field to move the slide body between the second position and the first position and also align an orientation of magnetic dipoles in the magenetocaloric material.

A fifteenth aspect relates to the integrated circuit thermal management of aspect 14, further comprising a deformable member coupled with the slide, the deformable member having a resting memory position that aligns the slide body with the second position, and the deformable member deformed away from the resting memory position as the magnetic field moves the slide body from the second position to the first position.

A sixteenth aspect relates to the integrated circuit thermal management system as in any of the preceding aspects, wherein the controller circuitry is configured to receive at least one operational parameter related to combustion in a gas turbine engine, the controller circuitry, in response to the at least one operational parameter, configured to initiate movement of the slide body between the second position and the first position, and energization of the electromagnetic coil.

A seventeenth aspect relates to the integrated circuit thermal management system of as in any preceding aspect, wherein the slide is a plurality of slides, the sensor is a plurality of sensors, and the integrated circuit is a plurality of spaced apart integrated circuits, a temperature of each of the spaced apart integrated circuits being sensed by a respective sensor, and the controller circuitry is configured to execute instructions stored in memory to control movement all of the slides between the first position and the second position and energization of the electromagnetic coil based on any one or more of the sensors reaching a threshold temperature.

A eighteenth aspect relates to a non-transitory computer readable media comprising instructions executable by a processor, the computer readable media comprising:
   instructions executable by the processor to monitor a temperature sensor sensing a temperature of an integrated circuit;
   instructions executable by the processor to enable a slide to move a slide body of the slide to a first position proximate a heat exchanger based on the temperature of the integrated circuit;

instructions executable by the processor to maintain an electromagnetic coil in an energized state while the slide body is in the first position, the slide body comprising the electromagnetic coil and a magnetocaloric material, the magnetocaloric material in thermal communication with the heat exchanger while in the first position;

instructions executable by the processor to enable the slide body to move to a second position proximate an integrated circuit;

instructions executable by the processor to maintain the electromagnetic coil in a deenergized state while the slide body is in the second position and the magnetocaloric material is in thermal communication with the integrated circuit; and instructions executable by the processor to enable the slide body to repeatedly move between the first position in thermal communication with the heat exchanger or the second position in thermal communication with the integrated circuit based on a temperature of the integrated circuit.

A nineteenth aspect relates to the computer readable media of aspect 17, further comprising:

instructions executable by the processor to monitor operational parameters related to combustion in a gas turbine engine; and instructions executable by the processor to control movement of the slide body in response to the operational parameters indicating a heating event.

A twentieth aspect relates to the computer readable media of aspect 17, further comprising:

instructions executable by the processor to monitor a sensor sensing the temperature of the integrated circuit and detect the temperature reaching a threshold; and instructions executable by processor to enable the slide body to repeatedly move according to the temperature reaching the threshold.

In addition to the features mentioned in each of the independent aspects enumerated above, some examples may show, alone or in combination, the optional features mentioned in the dependent aspects and/or as disclosed in the description above and shown in the figures.

What is claimed is:

1. An integrated circuit thermal management system comprising:
   an enclosure;
   a heat exchanger positioned on a first side of the enclosure;
   an integrated circuit positioned on a second side of the enclosure;
   a temperature sensor configured to generate a temperature signal indicative of a temperature of the integrated circuit;
   a slide disposed in the enclosure and extending between the heat exchanger and the integrated circuit, the slide comprising a moveable slide body;
   an electromagnetic coil and a magnetocaloric material positioned on the slide body; and
   a controller configured to control energization of the electromagnetic coil and movement of the magnetocaloric material on the slide between the heat exchanger and the integrated circuit based on the temperature signal.

2. The integrated circuit thermal management system of claim 1, wherein the electromagnetic coil is configured to activate the magnetocaloric material and moveably slide the magnetocaloric material on the slide between the heat exchanger and the integrated circuit.

3. The integrated circuit thermal management system of claim 1, further comprising a solenoid, the electromagnetic coil configured to activate the magnetocaloric material and the solenoid configured to moveably slide the magnetocaloric material and the electromagnetic coil between the heat exchanger and the integrated circuit.

4. The integrated circuit thermal management system of claim 1, further comprising a first heat pipe contiguously contacting and extending away from the heat exchanger, and a second heat pipe contiguously contacting and extending away from the integrated circuit toward the first heat pipe to provide a gap between the first heat pipe and the second heat pipe.

5. The integrated circuit thermal management system of claim 4, wherein the slide is aligned to reciprocate the slide body on a rail between the heat exchanger and the integrated circuit, the rail comprising the first heat pipe axially aligned with the second heat pipe, with the gap therebetween.

6. The integrated circuit cooling system of claim 4, wherein the magnetocaloric material is in thermal communication with the first heat pipe only when the magnetocaloric material and the electromagnetic coil are moved closer to the heat exchanger and the magnetocaloric material is in thermal communication with the second heat pipe only when the magnetocaloric material and the electromagnetic coil are moved closer to the integrated circuit.

7. The integrated circuit thermal management system of claim 1, further comprising a deformable member that is biased to maintain thermal communication between the magnetocaloric material and the heat exchanger or is biased to maintain thermal communication between the magnetocaloric material and the integrated circuit.

8. An integrated circuit thermal management system comprising:
   a slide comprising a slide body moveable between a first position and a second position;
   a heat exchanger positioned at the first position;
   an integrated circuit positioned at the second position;
   an electromagnetic coil disposed on the slide body;
   a magnetocaloric material disposed on the slide body and positioned within the electromagnetic coil;
   a sensor positioned to sense an operating temperature of the integrated circuit; and
   controller circuitry configured to execute instructions stored in memory to:
      receive a temperature signal from the sensor indicative of the sensed operating temperature; and
      control movement of the slide body between the first position and the second position and energization of the electromagnetic coil such that heat from the magnetocaloric material is transferred between the heat exchanger and the magnetocaloric material or heat from the integrated circuit is transferred between the magnetocaloric material and the integrated circuit according to the sensed operating temperature.

9. The integrated circuit thermal management system of claim 8, wherein the controller circuitry is configured to energize the electromagnetic coil while the slide body is at the first position and deenergize the electromagnetic coil while the slide body is at the second position.

10. The integrated circuit thermal management system of claim 8, wherein the heat exchanger includes a first thermal landing, and the integrated circuit includes a second thermal landing, and at least one of the magnetocaloric material or the slide body contiguously contact the first thermal landing in the first positon, and contiguously contact the second thermal landing in the second position.

11. The integrated circuit thermal management system of claim 10, wherein the first thermal landing comprises a first heat pipe extending away from the heat exchanger to contact the at least one of the magnetocaloric material or the slide body in the first position, and the second thermal landing is a second heat pipe extending away from the integrated circuit toward the first heat pipe to contact the at least one of the magnetocaloric material or the slide body in the second position, and the first heat pipe and the second heat pipe extending towards each other to create a gap therebetween.

12. The integrated circuit thermal management system of claim 10, wherein the first thermal landing comprises a first thermally conductive surface of the heat exchanger comprising a thermal paste, and the second thermal landing comprises a second thermally conductive surface of the integrated circuit, wherein the second thermally conductive surface comprises a thermal transfer paste with shock absorbing properties.

13. The integrated circuit thermal management system of claim 8, further comprising a solenoid, the solenoid energized and deenergized by the controller circuitry to move the slide body between the first position and the second position.

14. The integrated circuit thermal management system of claim 8, wherein the electromagnetic coil is arranged with respect to the slide and the magnetocaloric material to be energized by the controller circuitry and form a magnetic field to move the slide body between the second position and the first position and also align an orientation of magnetic dipoles in the magenetocaloric material.

15. The integrated circuit thermal management of claim 14, further comprising a deformable member coupled with the slide, the deformable member having a resting memory position that aligns the slide body with the second position, and the deformable member deformed away from the resting memory position as the magnetic field moves the slide body from the second position to the first position.

16. The integrated circuit thermal management system of claim 8, wherein the controller circuitry is configured to receive at least one operational parameter related to combustion in a gas turbine engine, the controller circuitry, in response to the at least one operational parameter, configured to initiate movement of the slide body between the second position and the first position, and energization of the electromagnetic coil.

17. The integrated circuit thermal management system of claim 8, wherein the slide is a plurality of slides, the sensor is a plurality of sensors, and the integrated circuit is a plurality of spaced apart integrated circuits, a temperature of each of the spaced apart integrated circuits being sensed by a respective sensor, and the controller circuitry is configured to execute instructions stored in memory to control movement all of the slides between the first position and the second position and energization of the electromagnetic coil based on any one or more of the sensors reaching a threshold temperature.

18. A non-transitory computer readable media comprising instructions executable by a processor, the computer readable media comprising:
   instructions executable by the processor to monitor a temperature sensor sensing a temperature of an integrated circuit;
   instructions executable by the processor to enable a slide to move a slide body of the slide to a first position proximate a heat exchanger based on the temperature of the integrated circuit;
   instructions executable by the processor to maintain an electromagnetic coil in an energized state while the slide body is in the first position, the slide body comprising the electromagnetic coil and a magnetocaloric material, the magnetocaloric material in thermal communication with the heat exchanger while in the first position;
   instructions executable by the processor to enable the slide body to move to a second position proximate an integrated circuit;
   instructions executable by the processor to maintain the electromagnetic coil in a deenergized state while the slide body is in the second position and the magnetocaloric material is in thermal communication with the integrated circuit; and
   instructions executable by the processor to enable the slide body to repeatedly move between the first position in thermal communication with the heat exchanger or the second position in thermal communication with the integrated circuit based on a temperature of the integrated circuit.

19. The computer readable media of claim 18, further comprising:
   instructions executable by the processor to monitor operational parameters related to combustion in a gas turbine engine; and
   instructions executable by the processor to control movement of the slide body in response to the operational parameters indicating a heating event.

20. The computer readable media of claim 18, further comprising:
   instructions executable by the processor to monitor a sensor sensing the temperature of the integrated circuit and detect the temperature reaching a threshold; and
   instructions executable by processor to enable the slide body to repeatedly move according to the temperature reaching the threshold.

* * * * *